Sept. 11, 1973 D. FALKENBERG ET AL 3,758,346

THERMOELECTRIC GENERATOR

Filed May 16, 1972

United States Patent Office 3,758,346

Patented Sept. 11, 1973

3,758,346

THERMOELECTRIC GENERATOR

Dieter Falkenberg, Erlangen, Theodor Renner, Nuremberg-Reichelsdorf, Gerhard Rittmayer, Erlangen, and Josef Winkler, Nuremberg, Germany, assignors to Siemens Aktiengesellschaft, Munich, Germany Filed May 16, 1972, Ser. No. 253,854

Claims priority, application Germany, May 17, 1971, P 21 24 465.1

Int. Cl. G21h *1/10*

U.S. Cl. 136—202 24 Claims

ABSTRACT OF THE DISCLOSURE

A thermoelectric generator for supplying current for heart pacemakers is disclosed. The thermoelectric generator has a radioactive heat source and a plurality of thermocouple elements formed using microfilm technology. The container of the isotope heat source is arranged between two thermocouple units having thin-film thermocouple elements. These elements are evaporated onto a foil of plastic which is coiled up to form a hollow cylinder. The container is configured as a body of rotational symmetry and is fixed between the ends of the thermocouple units. The thermoelectric generator affords the advantages of low structural height and high efficiency.

BACKGROUND OF THE INVENTION

Field of the invention

The invention relates to a thermoelectric generator with a plurality of thermocouples having leg portions which are alternatingly p and n conductive and are disposed between the container of a radioactive heat source and a cold heat exchanger.

Review of the prior art

The German Offenlegungschrift 1,539,313 discloses a thermoelectric generator with a plurality of thermocouples having hot solder junctions in contact with the container of a radioactive heat source. The legs of the individual thermocouples are in the form of wires, and the wires are woven to form a fabric. The radioactive heat source is arranged in a housing which has the shape of an elongated thin cylinder. The heat is essentially radiated from the surface of the cylinder. Several cylindrical containers may also be arranged parallel to each other in a common housing.

The thermocouples configured in the form of a wire fabric are wrapped around the heat source in such a manner that the hot solder joints are situated on the inside and the cold solder joints on the outside of the winding. In this construction, metallic thermocouples are provided, which, as is well known, have poor efficiency. Because the heat is radiated essentially perpendicularly to the cylindrical surface of the cylindrical housing and the wound thermocouples form approximately a cylinder concentric thereto, a substantial part of the heat flows transversely to the direction of the legs and is therefore not utilized to generate current. Moreover, the construction of this thermoelectric generator is relatively complicated.

From the German Auslegeschrift 1,539,274, a thermoelectric generator is known which consists of an assembly of individual structural units each containing a heat source of approximately cubical shape. On each of four flat sides of each unit, there is placed a leg of a thermocouple. The thermocouple legs are placed in such a manner that they are situated in a plane. A relatively flat structural unit is thus obtained of which a large number can be stacked and bolted together. This thermoelectric generator therefore takes up a relatively large space.

Swiss Pat. 502,677 discloses a thermoelectric generator with a radioactive heat source which is arranged in a cube-shaped housing. The thermocouples with legs that preferably consist of bismuth selenide $Bi_2Se_3$ are arranged on all six sides of the cube. The thermocouples can be made by evaporation of the conducting layer onto an insulating body, for example, glass. The thermocouples can also be of miniaturized configuration by means of microfilm techniques. If, however, the thermocouples are to be configured as structural elements between the hot and the cold sides, the legs themselves must be relatively thick to be mechanically stable.

In Swiss Pat. 413,018 it has also been suggested to apply the thermocouples to a flexible film of plastic in strip form which is formed in a particular manner, and to coil up the strip, together with an electrically insulating intermediate layer, to form a hollow cylinder.

From the prospectus "The Thermoelectric Microgenerators Alcatel" of the firm Alcatel of Paris, an embodiment of a thermoelectric generator for a heart pacemaker is known having a disc-shaped radioactive heat source arranged in a cylindrical housing. Between the bottom surface of the cylinder and a base plate, an approximately square thermoelectric module with thermocouples of bismuth telluride is placed. About 150 mg. of plutonium in the form of a plutonium alloy serves as the heat source and is enclosed in a double-walled container of tantalum and platinum. In addition to the plutonium, the cylindrical container comprises an empty space in which the helium generated in the fission process collects to prevent an excessive rise of the pressure in the container. The thermoelectric module is cemented with the hot side of its legs to the housing of the heat source. A metal jacket serves as the cold side of the thermoelectric generator and simultaneously takes over the heat removal as well as being a protective enclosure for the entire generator. In this embodiment, essentially on the bottom surface and/or the cover surface of the cylindrical isotope housing are utilized for the heat transfer via the thermoelectric generator. The heat radiated from the other parts of the surface of the relatively elongated cylinder cannot be utilized for energy conversion by the generator.

SUMMARY OF THE INVENTION

It is an object of the invention to improve the efficiency of thermoelectric generators of the last-mentioned type.

It is another object of the invention to provide a thermoelectric generator wherein the heat given off by the heat source of the generator is more effectively utilized than in the thermoelectric generators described above.

The thermoelectric generator of the invention is based on the realization that a special configuration of the housing or container of the heat source relative to the disposition of the thermocouple elements known per se will provide a substantially better utilization of the generated heat and thereby, in turn, provide a corresponding improvement of the efficiency of the composite generator.

According to a feature of the invention, two thermocouple units with thermocouple elements are provided in the form of respective annular bodies having ends containing the hot sides of the thermocouple elements; these ends fixedly hold the container of the heat source in place. According to a further feature, the annular bodies are thin-film thermocouple elements rolled up with an electrically insulating intermediate layer into respective hollow cylinders.

At least one of the two legs of each of the thermocouple elements can preferably consist of semiconductor material and can be applied directly onto the insulating intermediate layer, particularly by evaporation. The intermediate layer then serves as the carrier for the thermocouple elements and provides at the same time the required mechanical stability. The bridges between the couples may consist of metal, particularly, at least part silver, or also, of semiconductor material. The end of the wound thermocouple units at which the hot side of the thermocouples is situated, is in each case placed with good thermal contact onto the surface of the container of the heat source. According to the invention, these ends and the surface of the container are configured so that the container is centrally held between the thermocouple units and that, at the same time, good heat transfer from the container through the thermocouples to the cold heat exchanger is secured.

According to another feature of the invention, the container of the heat source may be configured as a body of rotational symmetry having a contour defined essentially by the bottom and top surfaces, the latter being inclined with respect to the axis of rotation. Respective end portions of the thermocouple units are shaped to correspond to and rest upon these surfaces. The container is then clamed between these end portions.

The container can be provided with at least one ring-like flange, on whose flat bottom and top surfaces one end of the thermocouple units is respectively placed. The inner diameter of the units is chosen so that the container is enclosed by the units. If the container consists of equal parts, each of these parts may also be provided with a flange. The portion of the container surrounded by the flange may advantageously have the shape of a spherical cap. The container may further have the shape of two cones or truncated cones having respective bases juxtaposed to define a common interface. The top surfaces of the truncated cones may, moreover, have the shape of spherical caps. The parts of the surface of the container which are not covered by the end of the thermocouple units are wrapped with heat-insulating material which prevents a transfer of heat here to a large extent.

The hot sides of the respective thermocouple units are always placed on the bottom and top surfaces respectively of the container. The thermocouple elements of the units are preferably applied onto a flexible film of electrically insulating material, particularly by evaporation. At least one of the legs of each thermocouple element can preferably consist of semiconductor material. The n-conductive leg may, for example, consist of indium antimonide InSb. The evaporated materials may advantageously be annealed after evaporation. Also, only one of the two legs, for example, the p-conductive leg may consist of semiconductor material, particularly, zinc antimonide ZnSb, and the other leg may consist of another material, for example, bismuth or a compound containing bismuth, preferably a bismuth-telluride alloy.

With these materials, a structural change is obtained through annealing following the evaporation which produces a substantial improvement of the thermoelectric properties. The carrier provided with the thin-film thermocouple elements is then coiled up to form a hollow cylinder, the outside diameter of which is about equal to the diameter of the outer rim of the isotope container or equal to the outside diameter of the flange of the container or housing. The hot sides of the hollow, cylindrical generator parts or units are always placed on the bottom and top rims, respectively, of the container. The opposite cold sides of the thermocouple elements are in thermal contact with a heat exchanger which may comprise, at least in part, metal, for example, stainless steel. The disc-shaped bottom and top surface portions which serve as the cold side, of the composite generator, may also comprise silverplated or goldplated copper. The choice of this cold side surface portion material is not critical. The material must only be thermally as well as electrically conducting because it must transfer the heat radiated from the heat source through the thermocouple element legs and the heat radiated onto the heat-insulating filler material to the outside. One end of the electric series circuit of the legs of the thermogenerator is respectively connected to these bottom and top surface portions. The other end of the circuit is best brought out, electrically insulated, through the lateral surface, or also from the bottom or the top surface of the thermoelectric generator. The metal plates therefore constitute one pole of the thermoelectric generator, and the electrical lead brought-out from the generator constitutes the other pole. The bottom and top plates may also be connected with each other in an electrically and thermally conducting manner. The entire housing then forms one pole of the thermoelectric generator.

Although the invention is illustrated and described herein as a thermoelectric generator, it is nevertheless not intended to be limited to the detail shown, since various modifications may be made therein within the scope and the range of the claims. The invention, however, together with additional objects and advantages will be best understood from the following description and in connection with the accompanying drawings.

BRIEF DESCRIPTION OF THE DRAWINGS

Embodiments of the thermoelectric generator according to the invention are illustrated in the following three figures described below. Similar or like components are designated by the same reference numeral in each figure in which they appear.

DESCRIPTION OF THE PREFERRED EMBODIMENTS

Figure 1:
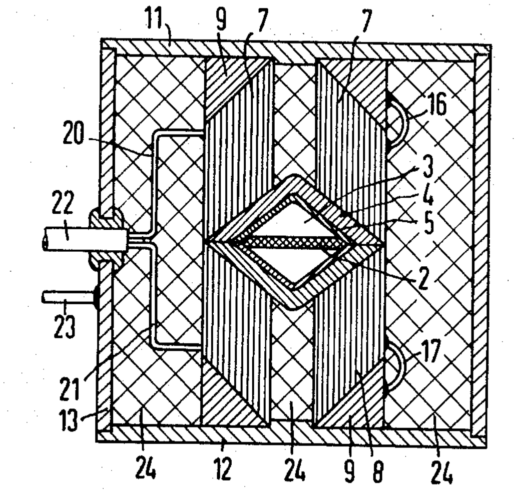
FIG. 1 is an elevation view, in section, of a thermoelectric generator equipped with a radioactive heat source as required by the invention.

Referring to FIG. 1, the thermoelectric generator includes cold heat exchanger means comprising plate-like members 11, 12 and two annular thermocouple units 7, 8 mutually aligned along a common axis. The units 7, 8 have respective first end portions in contact with the heat exchanger means. The units 7, 8 also have respective second end portions that fixedly hold radioactive heat means between the units. The container portion 4 of the heat means and the second end portions of the units 7, 8 have mating surfaces formed to fix the container between the units. The radioactive heat means include a radioactive heat source 2 disposed in the container.

Each of the thermocouple units can comprise a carrier means in the form of an electrically insulated thin carrier film wound into a hollow cylinder and a plurality of electrically connected thermocouple elements having a corresponding plurality of p-conductive legs and n-conductive legs alternately disposed and formed on the carrier film so as to extend between the heat exchanger means and the radioactive heat means. The conductive legs are generally designated by reference numeral 19 in FIG. 3. The p-conductive leg and the n-conductive leg of each thermocouple element is connected at the second end portion of the corresponding thermocouple unit to define the hot end of the element.

According to FIG. 1, a radioactive heat radiator 2 that functions as a heat source is arranged in a double-walled container. The heat radiator 2 is preferably plutonium 238. The container has two like outer housing parts 4, for example, of platinum, and two inner housing parts 5, for example, of tantalum, which are configured so as to have an essentially conical shape. The radiator 2 is clamped between these parts. The apexes of the conical parts 4, 5 are slightly rounded in practice which allows the two housing parts to be made in a simple manner by a press operation. On the bottom and top parts 4 are placed correspondingly shaped ends of respective wound thermocouple units 7 and 8. The other ends of the thermocouple units 7 and 8 are in contact via the projections 9 with cold heat-exchangers 11 and 12, respectively. The cold heat-exchangers 11 and 12 form the cover and base, respectively, of the entire configuration and may consist of electrically and thermally conducting material that is, for example, at least in part, metal, preferably, stainless steel. Heat insulating filler material is indicated by 24.

If the thermoelectric generator is intended as the current supply for a heart pacemaker, the cold heat exchangers 11 and 12 comprise a material compatible with human body tissue such as steel or a steel-aluminum alloy. The lateral cylindrical part of the housing is designated with 13. Electrical jumpers 16 and 17 are respectively connected between one end of the series circuit of the thermocouples and the bottom and top surfaces, respectively. The electrical connecting leads 20 and 21 forming the other pole of the generator are brought out from a lateral opening in the cylindrical jacket 13 and are connected to a common terminal 22. The other terminal is designated with 23 and is electrically connected with the cold heat exchangers 11 and 12.

The inside diameter of the hollow cylindrical units 7 and 8 is in each case selected so that there is no danger, because of the radius of curvature of the film, of breakage of the thermocouple bridges and legs. In this configuration, almost all heat radiated from the heat source 2 is utilized for energy conversion.

A particularly advantageous configuration of the thermoelectric generator is provided when the thermocouple units 7 and 8 are wound of carriers which are equipped on both flat sides with thermocouple elements which are preferably formed by evaporation or sputtering. With such a configuration, a larger number of thermocouple elements can be accommodated in a winding with given inside and outside diameters. In winding the carrier, the thermocouple elements are always electrically insulated from each other by an intermediate layer. However, an electrically insulating coating can also be applied to the thermocouple elements on at least one of the two sides, or the elements only may be provided with an electrically insulating surface layer which may contain silicon oxide or may consist of silicon oxide. One or both sides may further be provided with an electrically insulating varnish layer. It is only essential that in the finished winding, electrical contact between the elements of the different layers is avoided.

Figure 2:
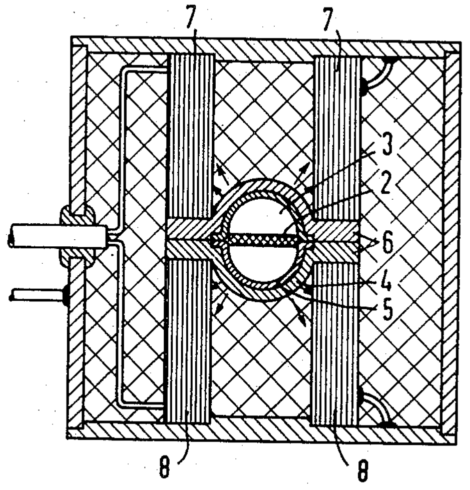
FIG. 2 is an elevation view, in section, illustrating another embodiment of the thermoelectric generator equipped with a heat source having a container of a somewhat different configuration than in the embodiment of FIG. 1.

In the embodiment according to FIG. 2, the heat source 2 is disposed in an approximately spherical container 3 with two inner capsule parts 5 and two outer shell parts 4. The outer parts 4 are each provided with a flange 6. The two flanges 6 are in contact with each other at respective flat sides thereof and are advantageously rigidly connected with each other and are, for example, soldered or welded together at their outer edge. The parts of the container which are closed by the flanges 6 can preferably be configured in the shape of a spherical cap or as a semisphere because a sphere has the most favorable surface-to-volume ratio. It is also possible to make these inner container parts in the shape of truncated cones with a common base or at least with bases facing each other. The top surface of such a truncated cone may again have the shape of a spherical cap. This shape has the advantage that the structural height of the entire arrangement is reduced because the hollow, cylindrical thermocouple windings 7 and 8 are separated only by the relatively thin layer of the flanges 6 and the total structural height therefore does not exceed essentially twice the length of the thermocouple legs. For the thermoelectric generator to function, it is sufficient that only one of the housing parts 4 be provided with a flange 6.

It may suffice in some cases if only one of the two parts 3 and 4 defines the volume of the container, while the other part merely constitutes the cover of this container; this cover can then be in the form of a disc. However, configuring both parts with a curved surface is more advantageous because then the heat radiated by the housing parts adjacent to the flanges 6 also reaches the thermocouple legs as is indicated in FIG. 2 by arrows. In this way, also this portion of the heat is utilized for the conversion of energy.

The radiator 2 which functions as the heat source can have almost any desired shape. Plutonium 238 is preferably suited as the heat source because its radioactive radiation can be stopped by metal shields of a few millimeters thickness. Its half-life is 86 years. A generator with this heat source has therefore the relatively long life of at least 10 years. Other heat sources, for instance americium 241, may, however, also be used.

Figure 3:
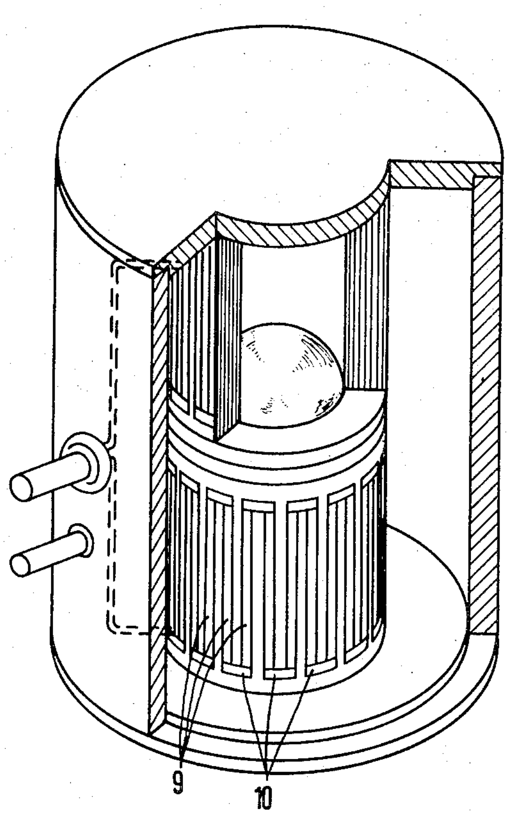
FIG. 3 is a perspective view of the thermoelectric generator of FIG. 1 which includes a breakout showing the disposition of the thermocouple elements on the thermocouple units.

Referring to FIG. 3, particularly high efficiency of the thermoelectric generator according to the invention is obtained by making the legs 19 and bridges 10 with their carrier using microelectronic techniques. The legs and/or bridges can preferably be formed by evaporation or sputtering. The material of the leg is preferably annealed after evaporation on the electrically insulating carrier, whereby the above-mentioned structural conversion of the leg material is obtained. A similar efficacious effect of the annealing process is obtained if other materials are used, for example, indium antimonide InSb. As a suitable material for the leg, bismuth telluride or other compounds can also be used. Particularly good thermoelectric properties are obtained with evaporated semiconductor material.

What is claimed is:

1. A thermoelectric generator comprising cold heat exchanger means; two annular thermocouple units mutually aligned along a common axis and having respective first end portions and respective second end portions, said first end portions being in contact with said heat exchanger means; and radioactive heat means fixedly held between said second end portions; each of said thermocouple units comprising annular carrier means, and a plurality of electrically connected thermocouple elements having a corresponding plurality of p-conductive legs and n-conductive legs alternately disposed and formed on said carrier means so as to extend between said heat exchanger means and said radioactive heat means, the p-conductive leg and the n-conductive leg of each thermocouple element being connected at said second end portion of the corresponding thermocouple unit to define the hot end of the element.

2. The thermoelectric generator of claim 1, said carrier means being an electrically insulating thin carrier film wound into a hollow cylinder, and said plurality of thermocouple elements being formed on said carrier film, and said radioactive heat means comprising a container, and a radioactive heat source disposed in said container, said second end portions of said thermocouple units and said container having mating surfaces formed to fixedly hold said container between said thermocouple units.

3. The thermoelectric generator of claim 2, each of said thermocouple units comprising electric insulating means for insulating the thermocouple elements from each other.

4. The thermoelectric generator of claim 3, said electric insulating means being an insulating film disposed between the respective coils of said wound carrier film.

5. The thermoelectric generator of claim 3, said electric insulating means being a layer of silicon dioxide disposed intermediate the respective coils of said wound carrier film.

6. The thermoelectric generator of claim 2, said container having a longitudinal axis coincident with said common axis and being a body rotationally symmetrical with respect to said longitudinal axis, said container having top and bottom surfaces inclined with respect to said longitudinal axis, said inclined surfaces being in thermal contact with the hot ends of said thermoelements.

7. The thermoelectric generator of claim 6, said container comprising two cone-shaped halves having respective bases juxtaposed to define a common interface.

8. The thermoelectric generator of claim 6, said container comprising two spherical-shaped caps having respective bases juxtaposed to define a common interface.

9. The thermoelectric generator of claim 6, said container having a ring-like flange, said second portions of said thermocouple units abutting respective lateral sides of said flange for fixedly holding said container between said units.

10. The thermoelectric generator of claim 6, said container being a two-walled enclosure, the walls of said container being made of respective dissimilar materials.

11. The thermoelectric generator of claim 2, at least one of the legs of each of said thermoelements being made of semi-conductive material evaporated onto said carrier film.

12. The thermoelectric generator of claim 11 wherein connecting bridges connect each two mutually adjacent legs of each of said thermocouple units, said bridges being made of semiconductor material and being likewise evaporated onto said carrier film.

13. The thermoelectric generator of claim 12, said carrier film being a strip-like carrier having respective flat sides, a portion of the thermoelements being formed on one of said flat sides and the remainder thereof being formed on the other flat side thereof.

14. The thermoelectric generator of claim 12, at least one of the legs of each of said thermoelements being made of zinc antimonide (ZnSb).

15. The thermoelectric generator of claim 12, at least one of the legs of each of said thermoelements being made of indium antimonide (InSb).

16. The thermoelectric generator of claim 12, at least one of the legs of each thermoelement being made of bismuth telluride (BiTe).

17. The thermoelectric generator of claim 2, at least one of the legs of each of said thermoelements being made of semi-conductive material sputtered onto said carrier film.

18. The thermoelectric generator of claim 17 wherein connecting bridges connect each two mutually adjacent legs of each of said thermocouple units, said bridges being made of semi-conductor material and being likewise sputtered onto said carrier film.

19. The thermoelectric generator of claim 18, said carrier film being a strip-like carrier having respective flat sides, a portion of the thermoelements being formed on one of said flat sides and the remainder thereof being formed on the other flat side thereof.

20. The thermoelectric generator of claim 18, at least one of the legs of each of said thermoelements being made of zinc antimonide (ZnSb).

21. The thermoelectric generator of claim 18, at least one of the legs of each of said thermoelements being made of indium antimonide (InSb).

22. The thermoelectric generator of claim 18, at least one of the legs of each thermoelements being made of bismuth telluride (BiTe).

23. The thermoelectric generator of claim 1 comprising a housing for holding said thermocouple units and radioactive heat means, said cold heat exchanger means comprising two electrically conductive plate-like members in contact with respective ones of said first end portions of said thermocouple units, at least a portion of said housing being said plate-like members, said housing comprising a housing part coaxial with said common axis and joining said plate-like members with each other, said housing part being made of thermally and electrically conducting material.

24. The thermoelectric generator of claim 23 wherein the thermoelectric generator serves to supply current for a heart pacemaker, said plate-like members being made at least partially of a metal alloy compatible with body tissue.

References Cited

UNITED STATES PATENTS 3,649,367 3/1972 Purdy .............. 136—205

FOREIGN PATENTS 502,677 3/1971 Switzerland .......... 136—202

HARVEY E. BEHREND, Primary Examiner

U.S. Cl. X.R.

136—208, 225